United States Patent [19]
Bailey et al.

[11] Patent Number: 5,248,657
[45] Date of Patent: Sep. 28, 1993

[54] METHOD FOR FORMING INTERNALLY HELIXED HIGH TEMPERATURE SUPERCONDUCTOR ASSEMBLY

[75] Inventors: Richard E. Bailey; Foster M. Kimball; Eddie M. Leung, all of San Diego, Calif.; Robert D. McConnell, Denver, Colo.

[73] Assignee: General Dynamics Corporation, Space Systems Division, San Diego, Calif.

[21] Appl. No.: 699,035

[22] Filed: May 13, 1991

[51] Int. Cl.⁵ .................... H01L 39/24; B05D 5/12
[52] U.S. Cl. .................... 505/1; 505/704; 505/730; 505/728; 505/701; 427/62; 427/237; 427/239; 427/419.2; 427/419.3; 219/121.68
[58] Field of Search .......... 505/1, 730, 704, 728; 427/62, 63, 419.2, 419.3, 237, 239; 174/125.1; 219/121.68

[56] References Cited

U.S. PATENT DOCUMENTS

| | | | |
|---|---|---|---|
| 4,957,900 | 9/1990 | Yamazaki | 505/1 |
| 4,965,247 | 10/1990 | Nishiguchi | 505/1 |
| 5,043,320 | 8/1991 | Meyer et al. | 505/1 |
| 5,044,406 | 9/1991 | Yamazaki | 505/1 |
| 5,132,283 | 7/1992 | McCune | 505/1 |

FOREIGN PATENT DOCUMENTS 02-56815  2/1990  Japan.

OTHER PUBLICATIONS

Asano et al, "High Tc oxide superconducting films for RF cavities", Proc. Workshop RF Supercond., 4th, 1989, vol. 2, pp. 723-743, 1990.

Yan et al, "Water interaction with the superconducting $YBa_2Cu_3O_7$ phase", Appl. Phys. Lett. 51(7) Aug. 1987 pp. 532-534.

*Primary Examiner*—Roy King
*Attorney, Agent, or Firm*—John R. Duncan

[57] ABSTRACT

A superconducting conductor assembly using high temperature materials. A double-walled tubular structure has at least one helical strip of superconductive material on the inner wall of the inside tube. Brittle, non-ductile superconducting materials may be used. A coolant, typically liquid nitrogen, is circulated between the tubes to maintain the superconductor below the critical temperature of the superconductor. A buffer layer is preferably included between tube wall and superconductor. A plurality of alternating layers of buffer and superconductor may be used.

3 Claims, 2 Drawing Sheets

METHOD FOR FORMING INTERNALLY HELIXED HIGH TEMPERATURE SUPERCONDUCTOR ASSEMBLY

BACKGROUND OF THE INVENTION

This invention relates in general to superconducting electrical conductors and, more specifically, to a tube having a high temperature superconductor formed along a helical internal path.

Materials which have superconducting properties; that is, have essentially no resistance at very low temperatures, have been known for some time. Superconductors have been used in a number of devices that take advantage of two unique properties of superconductivity, low (ideally zero) power consumption and the compactness possible with superconductors because of the absence of power dissipation losses and their high current density.

Ductile alloys of niobium and tin, titanium, tantalum, zirconium and other metals have been used in electromagnets in medical apparatus, experimental devices in physics, for energy generation in magnetohydrodynamic generators and are proposed for use in levitating trains and many other purposes. Unfortunately, these materials are superconducting only at temperatures below about 20K. and must be constantly cooled by liquid helium during use. Liquid helium is expensive and difficult to handle.

A number of "high temperature" superconducting ceramic materials were discovered in the late 1980's. "High temperature" is a relative term and now is generally taken to mean any temperature above the boiling temperature of liquid nitrogen, 78° K. The best known of these new superconductors contain one atom of a rare earth metal such as yttrium, two barium atoms, three copper atoms and about seven oxygen atoms and is referred to as a "1-2-3" superconductor. Other high temperature superconductor systems include bismuth-strontium-calcium-copper-oxide and thallium-barium-calcium-copper-oxide materials. It is expected that additional ceramic superconducting materials will be discovered.

While these high temperature superconductors have varying desirable characteristics, primary of which is the high superconducting transition temperature, they also have a number of drawbacks limiting their rapid introduction into commercial products. A major problem is material brittleness and lack of ductility, which prevents the convenient production of wires, filaments and the like. Also, these materials tend to have low critical current density, often less than 1000 A/sq. cm. These problems have prevented the use of these materials in such applications as large superconducting magnet coils and power transmission lines.

Thus, there is a continuing need for improved methods and apparatus which permit the use of the high temperature superconductors in such devices.

SUMMARY OF THE INVENTION

It is, therefore, an object of this invention to provide a conductor configuration that overcomes the above-noted problems. Another object is to provide a conductor configuration that fully supports brittle superconductors. A further object is to provide a high temperature superconducting conductor having integral cooling. Yet another object is to provide a conductor configuration which improves the current density available with high temperature superconducting materials.

The above objects, and others, are accomplished in accordance with this invention by an internally helixed conductor having a double walled tubular structure with thin film strips of superconducting material deposited on the inside wall of the inner tube in a helical pattern. Coolant, typically liquid nitrogen, is circulated between the walls of the inner and outer tubes to maintain the superconductor below the critical temperature. Any suitable superconductor may be used. The assembly of this invention is particularly adapted for use with high temperature superconductors such as yttrium-barium-copper oxide, barium-strontium-calcium-copper oxide and thallium-barium-calcium-copper oxide and similar materials. For the purposes of this application "high temperature superconductor" is considered to be those having a critical temperature above about 90 degrees Kelvin.

The strips of superconducting material may be single or multiple depending on the desired current capacity. The helical strips may be formed by any suitable method, such as lithographic techniques, chemical vapor deposition or the like, or application of uniform coatings followed by helical scribing using mechanical or laser processes. For best results, a layer of a material such as silver, titanium or nickel alloys, sapphire and combinations thereof, which is compatible with the superconductor may be applied on the inside wall of the inner tube followed by application of the superconductor over this buffer layer. Such buffer layers mitigate differences in thermal expansion between the superconductor and tube, provide protection against detrimental diffusion of tube elements (e.g., aluminum) into the superconductor and contribute to the crystalline formation of the superconductor layer. The crystallinity of the superconductor layer is desirable since better superconducting properties (e.g., higher critical current densities) are associated with larger crystalline grains within the layer. Additional layers of buffer and superconductor may be deposited and connected in parallel to provide higher current density.

The material and sizes of the tubes are selected to provide necessary containment of Lorentz forces during operation. Typical materials from which these tubes could be made include stainless steels, copper, aluminum and alloys thereof. Fiber reinforced resin composite materials may also be useful. The internal volume of the inside tube, within the superconductor layer(s) may be filled with an inert gas such as helium or nitrogen, to avoid degradation of the superconductor. The resulting tubular conductors may be used, for example in the manufacture of superconducting magnets, electrical transmission lines, etc.

BRIEF DESCRIPTION OF THE DRAWING

Details of the invention, and of preferred embodiments thereof, will be further understood upon reference to the drawing, wherein.

DETAILED DESCRIPTION OF PREFERRED EMBODIMENTS

Figure 2:
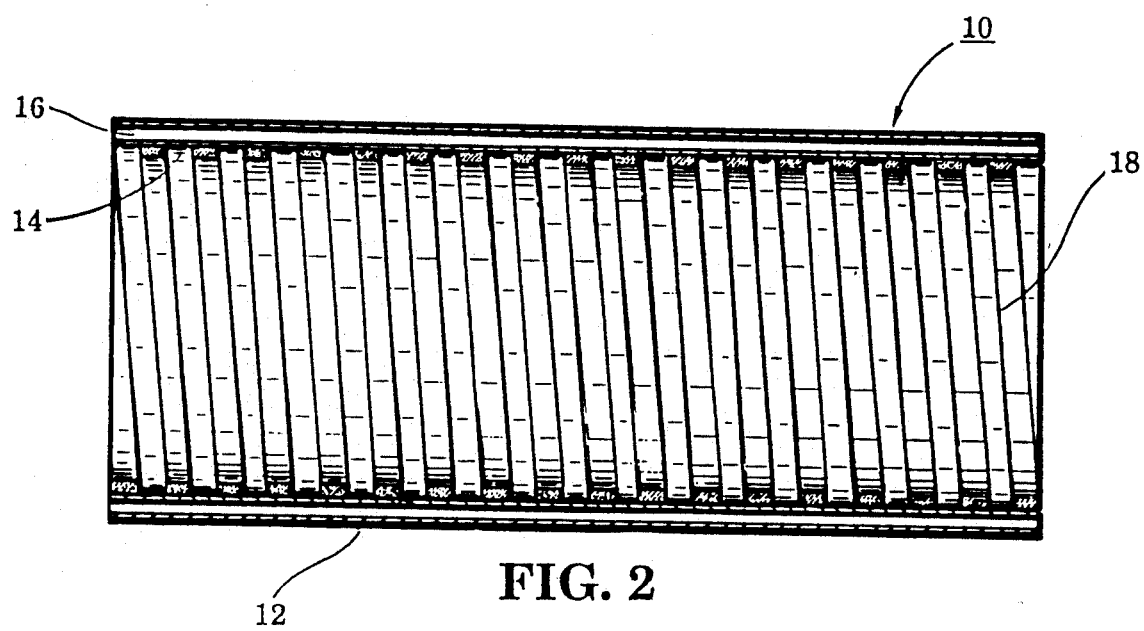
FIG. 2 is a section view taken on line 2—2 in FIG. 1.
Figure 1:
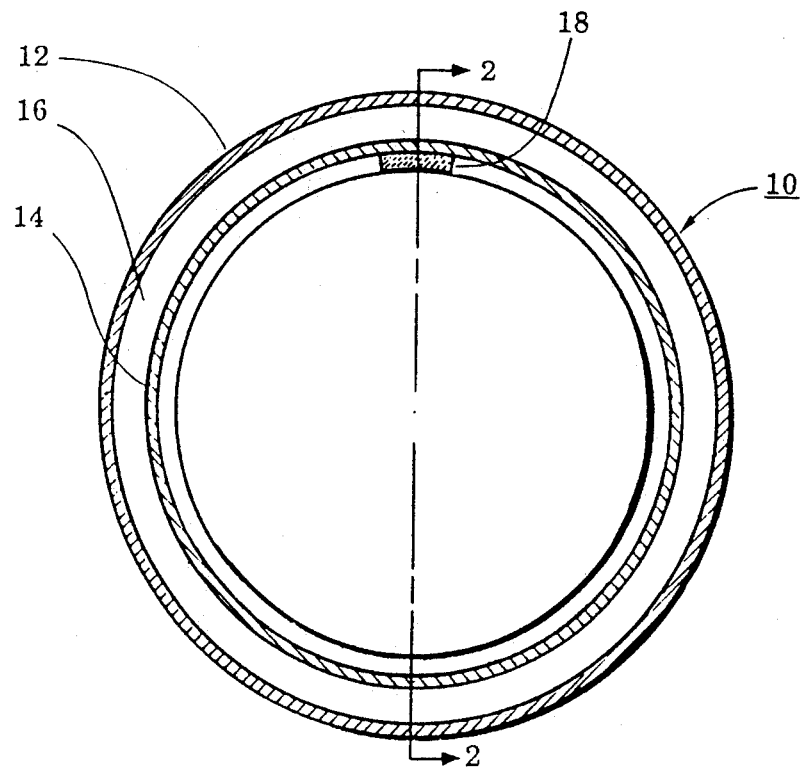
FIG. 1 is a transverse section view of the tubular conductor of this invention.

Referring now to FIGS. 1 and 2, there is seen a double walled tubular structure 10 having an outer wall 12, an inner wall 14 and a space 16 therebetween. The two walls can be maintained in their proper relationship by any conventional spacer means, such as a plurality of small buttons or other spacers (not shown) at suitable locations along and around the interior surface of tube 12. Tubes 12 and 14 may be formed from any suitable material. Typical materials include metals such as aluminum, stainless steel, copper nickel, titanium alloys and fiber reinforced resin composite materials and combinations thereof.

A single strip 18 of superconducting material is applied to the inside wall of tube 14 in a helical path as seen in FIG. 2. In most cases it is preferred that the strip of superconducting material be applied over a strip of a buffer material which avoids any interaction between the material of tube 14 and strip 18. Any suitable superconducting material may be used. Typical superconductors include the brittle "high temperature" superconductors such as yttrium-barium-copper oxide and the like. Any buffer material may be used which is compatible with the superconductor selected and the tube material. Typical buffer layer materials include silver, nickel and titanium alloys, sapphire and combinations thereof.

In order to protect the superconductor from degradation during use, it is preferable to either maintain a vacuum in interior space 20 or to fill that space with an inert gas such as helium, argon, or neon. Coolant is circulated through the space 16 between tubes 12 and 14. For present high temperature superconductors, liquid nitrogen is effective. Other coolants may be used if desired, depending upon the critical superconducting temperature threshold for the superconductor used.

Figure 4:
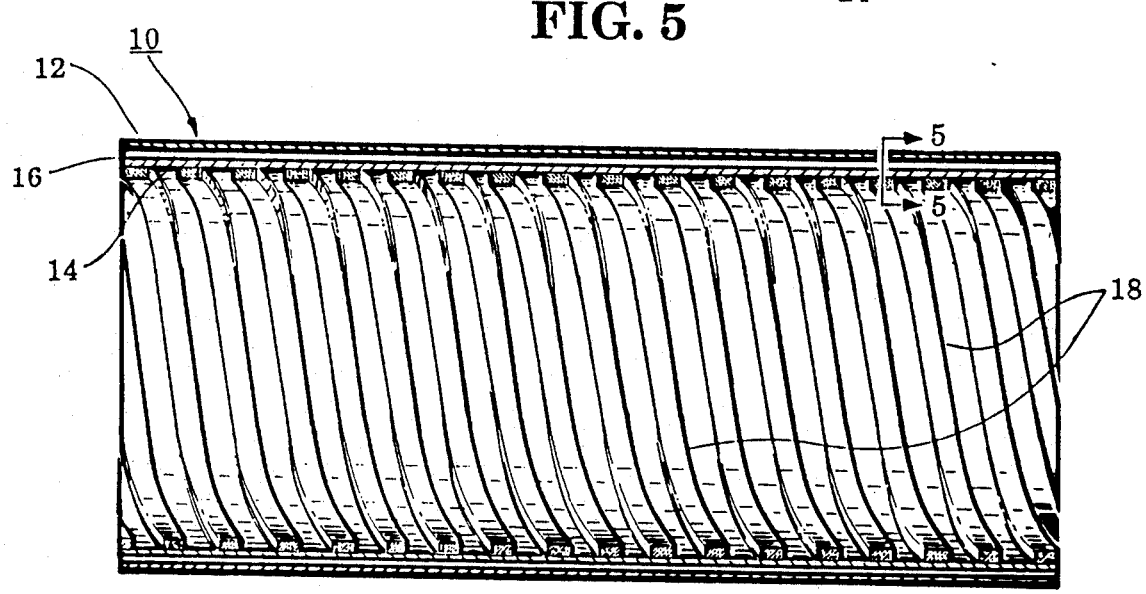
FIG. 4 is a section view taken on line 4—4 in FIG. 3.
Figure 3:
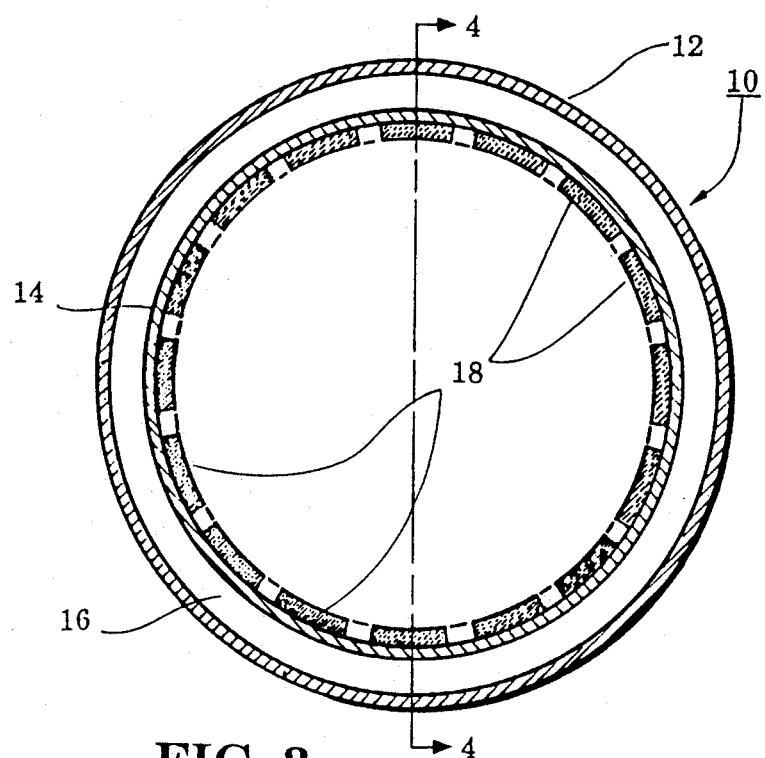
FIG. 3 is an end view of a second embodiment of the conductor, showing multiple superconductor strips.

A plurality of parallel superconducting strips 18 may be used as shown in FIGS. 3 and 4 to increase current density. Closely spaced superconductor strips may be formed by coating the entire inside wall of tube 14 with a buffer layer (if used) then coating the buffer layer with the selected superconductor. Closely spaced helical lines are then scribed through the superconductor and buffer layers by mechanical scribing, laser scribing or any other suitable method. The scribing separates the layers into plural parallel strips.

Figure 5:
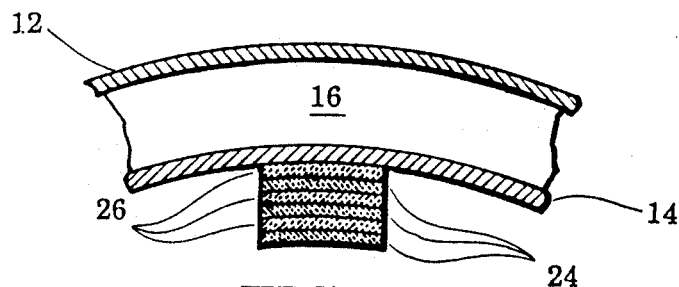
FIG. 5 is an enlarged detail section view of a portion of the tubular conductor assembly taken perpendicular to the tube axis.

In order to further increase current density, a multi-layer buffer and superconductor configuration may be used, as illustrated in FIG. 5. Here, alternating layers of buffer material 24 and superconducting material 26 are applied to the inside surface of tube 14. These layers may be applied using any suitable stencil or other pattern forming technique with chemical vapor deposition, plasma deposition or any other suitable method. Or, the entire inside surface of tube 14 may be coated with the succession of layers, then the helical pattern may be scribed through the entire multi-layer configuration, as discussed above.

While various specific configurations, materials and arrangements were described in the above description of preferred embodiments, those may be varied, where suitable, with similar results. Other applications, ramifications and variations of this invention will occur to those skilled in the art upon reading this disclosure. Those are intended to be included within the scope of this invention as defined in the appended claims.

We claim:
1. The method of manufacturing a high temperature superconductor assembly which comprises the steps of:
  (a) depositing a substantially uniform layer of buffer material on the inside wall of a first tube;
  (b) depositing a substantially uniform high temperature superconductor layer on said layer of buffer material;
  (c) repeating steps (a) and (b) at least one additional time; and
  (d) scribing through all layers except the buffer layer deposited on said inside wall to form a plurality of stacked substantially parallel helical superconductor strips.

2. The method according to claim 1 further including providing a second tube surrounding said first tube and introducing a flow of coolant between said first tube and second tube at a temperature sufficient to maintain said superconductor layer below the critical temperature.

3. The method according to claim 1 further including maintaining a vacuum or inert gas within said first tube.

* * * * *